(12) United States Patent
Yuan et al.

(10) Patent No.: US 8,004,001 B2
(45) Date of Patent: Aug. 23, 2011

(54) FABRICATION OF SEMICONDUCTOR DEVICES FOR LIGHT EMISSION

(75) Inventors: Shu Yuan, Singapore (SG); Xuejun Kang, Singapore (SG); Daike Wu, Singapore (SG)

(73) Assignee: Tinggi Technologies Private Limited, Science Park I (SG)

( * ) Notice: Subject to any disclaimer, the term of this patent is extended or adjusted under 35 U.S.C. 154(b) by 365 days.

(21) Appl. No.: 12/088,849

(22) PCT Filed: Sep. 1, 2006

(86) PCT No.: PCT/SG2006/000254
§ 371 (c)(1), (2), (4) Date: Mar. 31, 2008

(87) PCT Pub. No.: WO2007/737762
PCT Pub. Date: Apr. 5, 2007

(65) Prior Publication Data
US 2008/0210969 A1    Sep. 4, 2008

(30) Foreign Application Priority Data
Sep. 29, 2005 (SG) ............................... 200506301-1

(51) Int. Cl.
*H01L 33/00* (2010.01)
(52) U.S. Cl. ............ 257/98; 257/94; 257/747; 257/751; 257/758; 257/E33.062
(58) Field of Classification Search .............. 257/94, 257/98, 747, 751, 758
See application file for complete search history.

(56) References Cited

U.S. PATENT DOCUMENTS

| | | | |
|---|---|---|---|
| 3,897,627 A | 8/1975 | Klatskin | |
| 4,107,720 A | 8/1978 | Pucel et al. | |
| 5,129,987 A | 7/1992 | Khan et al. | |
| 5,405,804 A | 4/1995 | Yabe | |
| 5,654,228 A | 8/1997 | Shieh et al. | |
| 5,811,927 A | 9/1998 | Anderson et al. | |
| 6,020,261 A | 2/2000 | Weisman | |
| 6,091,085 A | 7/2000 | Lester | |
| 6,169,297 B1 | 1/2001 | Jang et al. | |
| 6,210,479 B1 | 4/2001 | Bojarczuk et al. | |

(Continued)

FOREIGN PATENT DOCUMENTS
CN   1373522 A   10/2002
(Continued)

OTHER PUBLICATIONS

PCT International Preliminary Report on Patentability for PCT Counterpart Application No. PCT/SG2006/000254, 4 pgs., (Jun. 1, 2007).

(Continued)

*Primary Examiner* — Wai-Sing Louie
(74) *Attorney, Agent, or Firm* — Blakely, Sokoloff, Taylor & Zafman LLP.

(57) ABSTRACT

A semiconductor device for light emission having a plurality of epitaxial layers with an n-type layer for light emission and a p-type layer for light reflection. The p-type layer has at least one seed layer for an outer layer of a conductive metal. The at least at least one seed layer is a material for providing a buffer for differential thermal expansion of the outer layer and the light reflecting layer.

9 Claims, 16 Drawing Sheets

U.S. PATENT DOCUMENTS

| | | | |
|---|---|---|---|
| 6,303,405 B1 | 10/2001 | Yoshida et al. | |
| 6,307,218 B1 | 10/2001 | Steigerwald et al. | |
| 6,319,778 B1 | 11/2001 | Chen et al. | |
| 6,365,429 B1 | 4/2002 | Kneissl et al. | |
| 6,420,242 B1 | 7/2002 | Cheung et al. | |
| 6,420,732 B1 | 7/2002 | Kung et al. | |
| 6,426,512 B1 | 7/2002 | Ito et al. | |
| 6,448,102 B1 | 9/2002 | Kneissl et al. | |
| 6,492,661 B1 | 12/2002 | Chien et al. | |
| 6,562,648 B1 | 5/2003 | Wong et al. | |
| 6,573,537 B1 | 6/2003 | Steigerwald et al. | |
| 6,589,857 B2 * | 7/2003 | Ogawa et al. | 438/502 |
| 6,627,921 B2 | 9/2003 | Wong et al. | |
| 6,649,437 B1 | 11/2003 | Yang et al. | |
| 6,677,173 B2 | 1/2004 | Ota | |
| 6,821,804 B2 | 11/2004 | Thibeault et al. | |
| 7,338,822 B2 | 3/2008 | Wu et al. | |
| 7,348,212 B2 * | 3/2008 | Schiaffino et al. | 438/106 |
| 2001/0055324 A1 | 12/2001 | Ota | |
| 2002/0022286 A1 | 2/2002 | Nikolaev et al. | |
| 2002/0034835 A1 | 3/2002 | Chen et al. | |
| 2002/0093023 A1 | 7/2002 | Camras et al. | |
| 2002/0113279 A1 | 8/2002 | Hanamaki et al. | |
| 2002/0117681 A1 | 8/2002 | Weeks et al. | |
| 2002/0134985 A1 | 9/2002 | Chen et al. | |
| 2002/0137243 A1 | 9/2002 | Chen et al. | |
| 2002/0179910 A1 | 12/2002 | Slater, Jr. | |
| 2003/0038284 A1 | 2/2003 | Kurahashi et al. | |
| 2003/0064535 A1 | 4/2003 | Kub et al. | |
| 2003/0111667 A1 | 6/2003 | Schubert | |
| 2003/0151357 A1 | 8/2003 | Uemura | |
| 2003/0189212 A1 | 10/2003 | Yoo | |
| 2003/0189215 A1 | 10/2003 | Lee et al. | |
| 2004/0026709 A1 | 2/2004 | Bader et al. | |
| 2004/0065889 A1 | 4/2004 | Ueda et al. | |
| 2004/0104395 A1 | 6/2004 | Hagimoto et al. | |
| 2004/0110395 A1 | 6/2004 | Ueda et al. | |
| 2004/0130037 A1 | 7/2004 | Mishra et al. | |
| 2004/0217362 A1 * | 11/2004 | Slater et al. | 257/79 |
| 2004/0235210 A1 | 11/2004 | Tamura et al. | |
| 2005/0014303 A1 | 1/2005 | Tsai et al. | |
| 2005/0026399 A1 | 2/2005 | Chien et al. | |
| 2005/0035354 A1 | 2/2005 | Lin et al. | |
| 2005/0082555 A1 | 4/2005 | Chien et al. | |
| 2005/0087884 A1 | 4/2005 | Stokes et al. | |
| 2005/0093002 A1 | 5/2005 | Tsai et al. | |
| 2005/0098792 A1 | 5/2005 | Lee et al. | |
| 2005/0127397 A1 | 6/2005 | Borges et al. | |
| 2005/0142875 A1 | 6/2005 | Yoo | |
| 2005/0164482 A1 | 7/2005 | Saxlar | |
| 2006/0006554 A1 | 1/2006 | Yoo et al. | |
| 2006/0099730 A1 | 5/2006 | Lee et al. | |
| 2006/0124939 A1 | 6/2006 | Lee et al. | |
| 2006/0151801 A1 | 7/2006 | Doan et al. | |
| 2006/0154390 A1 | 7/2006 | Tran et al. | |
| 2006/0154391 A1 | 7/2006 | Tran et al. | |
| 2006/0154392 A1 | 7/2006 | Tran et al. | |
| 2006/0154393 A1 | 7/2006 | Doan et al. | |
| 2006/0157721 A1 * | 7/2006 | Tran et al. | 257/98 |
| 2006/0163586 A1 | 7/2006 | Denbaars et al. | |
| 2006/0186418 A1 | 8/2006 | Edmond et al. | |
| 2007/0029541 A1 | 2/2007 | Xin et al. | |
| 2008/0164480 A1 | 7/2008 | Kang et al. | |
| 2008/0210970 A1 | 9/2008 | Kang et al. | |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| JP | 50-074876 | 6/1975 |
| JP | 52-055480 | 5/1977 |
| JP | 59-112667 | 6/1984 |
| JP | 04-078186 | 3/1992 |
| JP | 05-291621 | 11/1993 |
| JP | 10-117016 | 5/1998 |
| JP | 2000-183400 | 6/2000 |
| JP | 2000-277804 | 10/2000 |
| JP | 2000-294837 | 10/2000 |
| JP | 2001-036129 | 2/2001 |
| JP | 2001-049491 | 2/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-303743 | 10/2003 |
| JP | 2003-347590 | 12/2003 |
| JP | 2004-072052 | 3/2004 |
| JP | 2004-088083 | 3/2004 |
| JP | 2005-012188 | 1/2005 |
| JP | 2005-236048 | 9/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200401964-2 | 4/2004 |
| SG | 200506897-8 | 10/2005 |
| SG | 200508210-2 | 12/2005 |
| SG | 200605500-8 | 8/2006 |
| SG | 200606050-3 | 9/2006 |
| TW | 419836 B | 1/2001 |
| TW | 475276 B | 2/2002 |
| TW | 540171 | 1/2003 |
| WO | WO 01/47039 A1 | 6/2001 |
| WO | WO 2004/102686 A1 | 11/2004 |
| WO | WO 2005/029572 A1 | 3/2005 |
| WO | WO 2005/029573 A1 | 3/2005 |
| WO | WO 2005/064666 A1 | 7/2005 |
| WO | WO 2005/088743 A1 | 9/2005 |
| WO | WO 2005/098974 A1 | 10/2005 |
| WO | WO 2005/104780 A2 | 11/2005 |
| WO | WO 2007/046773 A1 | 4/2007 |
| WO | WO 2007/073354 A1 | 6/2007 |
| WO | WO 2008/020819 A1 | 2/2008 |
| WO | WO 2008/030188 A1 | 3/2008 |

OTHER PUBLICATIONS

PCT Written Opinion of the International Searching Authority for PCT Counterpart Application No. PCT/SG2006/000254, 4 pgs., (Nov. 16, 2006).

Ueda, Tetsuzo, et al., "Vertical InGaN-based Blue Light Emitting Diode with Plated Metal Base Fabricated Using Laser Lift-Off Technique", Wiley—VCH Verlag-GmbH & Co., Phys. Stat. sol. (c) 0, No. 7, 2219-2222 (2003), 4 pages.

Li, W. H., et al., "Electrochemical Deposition of Copper on Patterned Cu/Ta(N)/SiO$_2$ Surfaces for Super Filling of Sub-Micron Features", Journal of Applied Electrochemistry 31: 1395-1397 (2001), 3 pages.

Chu, Chen-Fu, et al., "Comparison of p-Side Down and p-Side Up GaN Light-Emitting Diodes Fabricated by Laser Lift-Off", Jpn. J. Appl. Phys. vol. 42 (2003) pp. L147-L150, Part 2, No. 2B, Feb. 15, 2003, 4 pages.

M.K. Kelly, et al., "Optical Process for Liftoff of Group III-Nitride Films," Physica Status Solidi (a), vol. 159, Issue 1, pp. R3-R4, (Nov. 28, 1996).

Zhifang Fan, et al., "Very Low Resistance Multilayer Ohmic Contact to $n$-GaN," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the $p$-GaN Surface," Journal of Applied Physics, vol. 93. Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P$/GaP Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding." Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAlP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report. 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Counterpart Application No. PCT/SG2005/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Application No. PCT/SG2007/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

* cited by examiner

US 8,004,001 B2

FABRICATION OF SEMICONDUCTOR DEVICES FOR LIGHT EMISSION

CROSS-REFERENCE TO OTHER APPLICATIONS

This is a National Phase of International Application No. PCT/SG2006/000254, filed on Sep. 1, 2006, which claims priority from Singaporean Patent Application No. SG200506301-1, filed on Sep. 29, 2005.

FIELD OF THE INVENTION

This invention relates to the fabrication of semiconductor devices for fight emission and refers particularly, though not exclusively, to the fabrication of such semiconductor devices on a sapphire substrate.

BACKGROUND TO THE INVENTION

GaN semiconductor devices such as, for example, light emitting diodes ("LEDs"), laser diodes, photodetectors, transistors, switches, and so forth, are widely used in many applications. Well known applications include, but are not limited to, traffic signals, mobile telephone display backlighting, liquid crystal display ("LCD") back lighting, flash lights for cameras, and so forth. The fabrication of gallium nitride semiconductors for use as LEDs, laser diodes or lighting, gives relatively tow productivity. Also, known techniques result in semiconductor devices with a light output that is not optimised.

SUMMARY OF THE INVENTION

In accordance with a first preferred aspect there is provided a semiconductor device for light emission comprising;
(a) a plurality of epitaxial layers comprising an active layer for light generation, an n-type layer for light transmission and a p-type layer for light reflection;
(b) the p-type layer having thereon at least one seed layer for an outer layer of a conductive metal;
(c) at least one seed layer comprising a material for providing a buffer for differential thermal expansion of the outer layer and the light reflecting layer.

The at least one seed layer may also comprises a diffusion barrier for providing a barrier to diffusion of a layer applied to it from diffusing into at least one of the p-type layer, the active layer and the n-type layer.

According to a second preferred aspect there is provided a semiconductor device for light emission comprising:
(a) a plurality of epitaxial layers comprising an active layer for tight generation, an n-type layer for light transmission and a p-type layer for light reflection;
(b) the p-type layer having thereon at least one seed layer for an outer layer of a conductive metal;
(c) at least one seed layer comprising a diffusion barrier for providing a barrier to diffusion of a layer applied to it from diffusing into at least one of the p-type layer, the active layer and the n-type layer.

For the second aspect the at least one seed layer may also comprise a material for providing a buffer for differential thermal expansion of the outer layer and the light reflecting layer.

For both aspects the at least one seed layer may comprise a plurality of seed layers, the plurality of seed layers comprising a first seed layer of reflective material, and haying a first co-efficient of thermal expansion, and a second seed layer of a second material having a second coefficient of thermal expansion. The second co-efficient of thermal expansion may be greater than the first co-efficient of thermal expansion.

The n-type layer may comprise an array of an n-type metal. The outer layer and the array of n-type metal may comprise the terminals of the semiconductor device.

According to a third preferred aspect there is provided a semiconductor device for light emission comprising a plurality of epitaxial layers, the plurality of epitaxial layers comprising:
(a) a p-type layer;
(b) at least one reflective layer on the p-type layer;
(c) an outer layer of a conductive material on the at least one reflective layer;
(d) an n-type layer; and
(e) an n-type metal on the n-type layer;
(f) an active layer between the n-type layer and the p-type layer;
the n-type metal being arranged in an array at the centre of the n-type layer for minimizing its effect on light output; the n-type metal and the outer layer being the terminals for the semiconductor device.

The plurality of seed layers may comprise a first seed layer of reflective material and having a first co-efficient of thermal expansion, and a second seed layer of a second material having a second co-efficient of thermal expansion; the second co-efficient of thermal expansion being greater than the first co-efficient of thermal expansion.

For all three aspects, between the first seed layer and the second seed layer there may be at least one intermediate seed layer of at least one intermediate material having a intermediate co-efficient of thermal expansion, the intermediate co-efficient of thermal expansion being greater than the first co-efficient of thermal expansion and less that the second co-efficient of thermal expansion. The outer layer may be of the second material. The reflective material, the second material and the intermediate material may ail be different. The intermediate material may be the diffusion barrier for preventing the second material diffusing into the epitaxial layers. The outer layer may be relatively thick and may be for at least one of: a structural support, a heat sink, a heat dissipater, a current dissipater, and as a terminal, for the semiconductor device. The array may comprise a central portion, an outer portion, and a joining portion connecting the central portion and the outer portion; the outer portion and the joining portion being for current dissipation. The semiconductor device may be a gallium nitride semiconductor device; and the outer layer may be of the second material.

According to a fourth preferred aspect there is provided method for fabrication of a semiconductor device for light emission, the method comprising:
(a) on a p-type layer of plurality of epitaxial layers of the semiconductor device, forming a layer of a p-type metal; and
(b) on the layer of p-type metal, applying a first seed layer of a plurality of seed layers, the first seed layer being of a first material that is light reflective and has a first co-efficient of thermal expansion; and
(c) forming on the first seed layer a second seed layer of the plurality of seed layers, the second seed layer being of a second material that has a second co-efficient of thermal expansion, the second co-efficient of thermal expansion being greater than the first co-efficient of thermal expansion.

(b) on the layer of p-type metal, applying at least one seed layer as a diffusion barrier for providing a barrier to diffusion of a layer applied to it from diffusing into the p-type layer.

One of the plurality of seeds layers may be a diffusion barrier for providing a barrier to diffusion of a layer applied to it from diffusing into the p-type layer.

According to a fifth preferred aspect there is provided a method for fabrication of a semiconductor device for light emission, the method comprising:

(a) on a p-type layer of plurality of epitaxial layers of the semiconductor device, forming a layer of a p-type metal; and (b) on the layer of p-type metal, applying at least one seed layer as a diffusion barrier for providing a barrier to diffusion of a layer applied to it from diffusing into the p-type layer.

The at least one seed layer may comprise a plurality of seed layers, a first seed layer being of a first material that is light reflective and has a first co-efficient of thermal expansion; and forming on the first seed layer a second seed layer of the plurality of seed layers, the second seed layer being of a second material that has a second so-efficient of thermal expansion, the second co-efficient of thermal expansion being greater than the first co-efficient of thermal expansion.

For the fourth and fifth aspects the method may further comprise forming an outer layer on the second seed layer, the outer layer being relatively thick and being for at least one selected from the group consisting of: a structural support, a heat sink, a heat dissipater, a current dissipater, and as a terminal, for the semiconductor device. An array of an n-type metal may be formed on an n-type metal layer of the plurality of epitaxial layers. The array and the outer layer may be the terminals of the semiconductor device.

According to a sixth preferred aspect there is provided a method of fabricating a semiconductor device for light emission comprising a plurality of epitaxial layers, the method comprising:

on a p-type layer of the plurality of epitaxial layers forming a first seed layer of a plurality of seed layers as a reflective layer;

on the plurality of seed layers forming an outer layer of a conductive material;

on an n-type layer of the plurality of epitaxial layers forming an n-type metal in an array at the centre of the n-type layer for minimizing its effect on light output; the n-type metal and the outer layer being the terminals for the semiconductor device.

The first seed layer may be of a reflective material and has a first co-efficient of thermal expansion, the method preferably further comprising forming on the first seed layer a second seed layer of a second material having a second co-efficient of thermal expansion; the second co-efficient of thermal expansion being greater than the first co-efficient of thermal expansion.

The methods may further comprise forming at least one intermediate seed layer on the first seed layer before the second seed layer is formed, the at least one intermediate seed layer being of at least one material having an intermediate co-efficient of thermal expansion that is greater than the first co-efficient of thermal expansion and less than the second co-efficient of thermal expansion. The outer layer may be of the second material. The reflective material, the second material and the intermediate seed layer material may all be different. The semiconductor device may be a gallium nitride semiconductor device.

According to a seventh preferred aspect them is provided a method of fabricating a semiconductor device for light emission comprising a plurality of epitaxial layers mounted on a substrate, the method comprising:

separating the substrate from the plurality of epitaxial layers while the plurality of epitaxial layers are intact for preserving electrical and mechanical properties of the plurality of epitaxial layers.

The method may further comprise: prior to separation forming at least one seed layer on the plurality of epitaxial layers, and forming an outer layer on the at least one seed layer, the outer layer being relatively thick and being for at least one selected from the group consisting of: a structural support, a heat sink, a heat dissipater, a current dissipater, and as a terminal, for the semiconductor device.

After the at least one seed layer is formed, and before the outer layer is formed on the at least one seed layer, the following steps may be performed:

(a) applying a p-type metal ohmic contact layer to a p-type layer of a plurality of epitaxial layers;

(b) applying a layer of an oxide over the p-type metal ohmic contact layer and the p-type layer;

(c) removing the oxide layer from above the metal ohmic contact layer; and (d) depositing the at least one seed layer on the oxide layer and the metal ohmic contact layer.

After step (d) and before the outer layer is formed, a pattern of thick resists may be applied to the at least one seed layer, the outer layer being formed between the pattern of thick resists. The outer layer may also be formed over the pattern of thick resists. The outer layer may be polished subsequent to separation. The oxide layer may be silicon dioxide.

Subsequent to separation of the substrate, the following steps may be performed:

(a) a first stage of isolation of individual devices by trench etching along edges of each mesa;

(b) pad etching;

(c) die isolation;

(d) forming an array of n-type ohmic contacts on an n-type layer of the plurality of epitaxial layers; and (e) die separation.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings. in the drawings.

DETAILED DESCRIPTION OF THE PREFERRED EMBODIMENTS

The GaN devices described below are fabricated from epitaxial wafers that consist of a stack of thin semiconductor layers (called epitaxial layers) on a sapphire substrate. The composition and thickness of the epitaxial layers depends on the wafer design, and determine the light color (wavelength) of light that will be emitted by the devices that are fabricated from the wafer. Usually a thin buffer layer is first deposited on the sapphire substrate with a thickness often in the range 10 to 30 nm, and can be either AlN or GaN. In this specification this layer is not described or illustrated. On top of the thin buffer layer, other layers made of GaN, AlGaN, InN, InGaN, AlGaInN, and so forth, are deposited. To achieve high wafer quality, n-type layers are often deposited on the buffer layer, followed by an unintentionally doped active region. Finally, p-type doped layers are deposited. The active region is usually a double heterostructure made of a single quantum well, or multiple quantum wells and is for light generation. But it may be in other forms such as, for example, quantum dots, The deposition of epitaxial layers is usually by metal organic chemical vapor deposition ("MOCVD") or molecular beam epitaxy ("MBE"). The thickness of the epitaxial layers is in the range from a few nanometers to a few microns.

Figure 1:
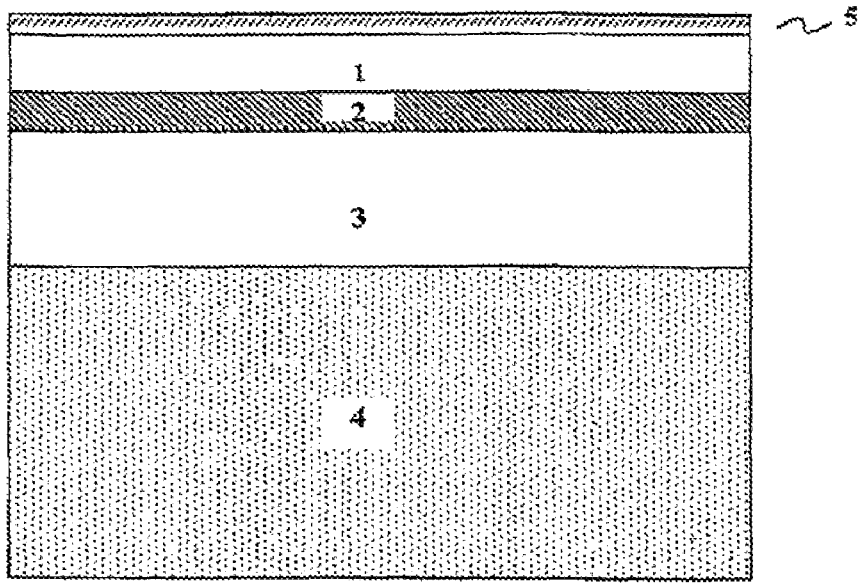
FIG. 1 is a non-scale schematic, cross-sectional view of a semiconductor at a first stage in the fabrication process.
Figure 2:
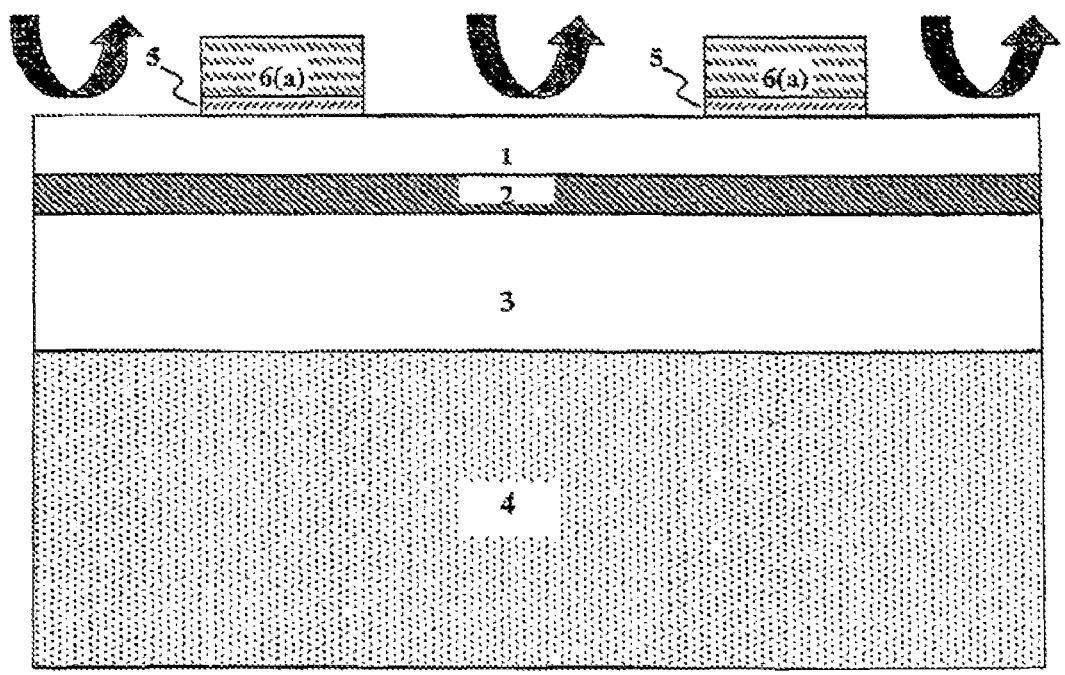
FIG. 2 is a non-scale schematic, cross-sectional view of a semiconductor at a second stage in the fabrication process.

To first refer to FIG. 1, the process starts after the sapphire substrate 4 has applied to it the n-type layer 3 of gallium nitride (GaN), the quantum well or active layer 2, and the p-type layer 1 of GaN, The p-metal layer S is then applied over the p-type layer 1. The p-type metal layer 5 may be of nickel-gold (NiAu) or other suitable metal. Standard photolithography and etching are then used to pattern layer 5, This is done by applying a thin layer of photoresist (layer 8(a) in FIG. 2) on to metal layer 5, followed by resist exposure and development. The resist pattern 6(a) serves as an etching mask for etching the metal layer 5. The etching may be by wet chemical etching or plasma dry etching (see FIG. 2). The photoresist 6(a) is then removed. The patterned layer 5 that remains on the surface of p-type GaN layer 1 will serve as an ohmic contact layer to the p-type GaN layer 1, Annealing may take place either before or after layer 5 is patterned, The p-type Layer 1 is relatively thin—normally no more, but preferably less, than 1 micron.

Figure 3:
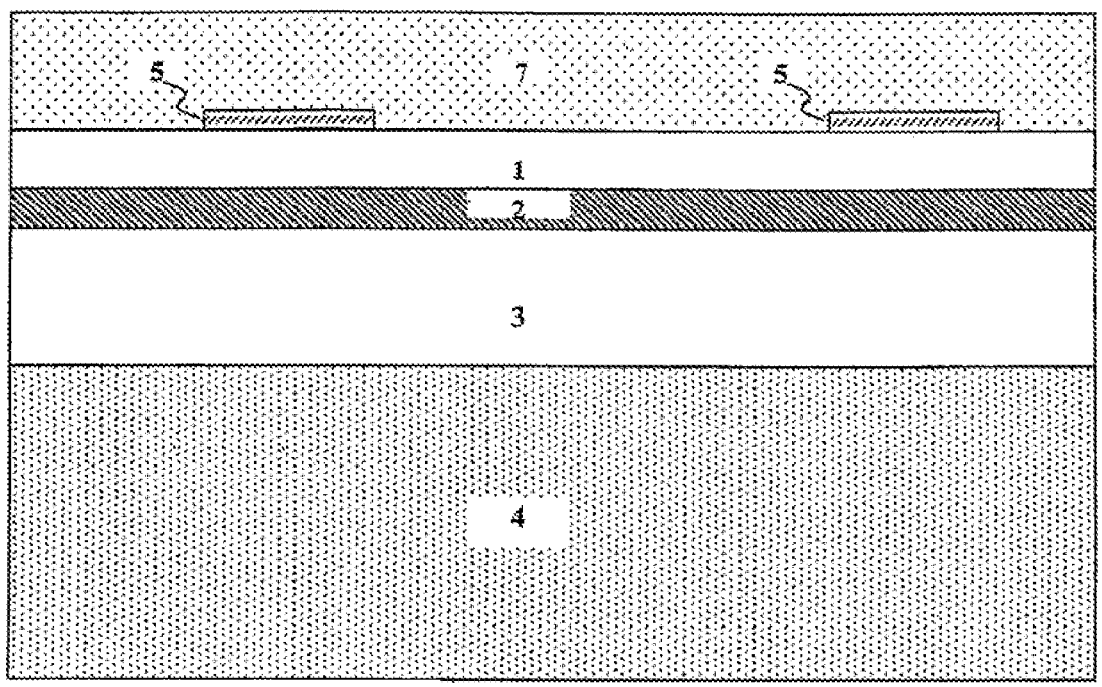
FIG. 3 is a non-scale schematic, cross-sectional view of a semiconductor at a third stage in the fabrication process.

A layer 7 of silicon dioxide ($SiO_2$) is deposited over the remaining p-metal layer portions 5 and the P-type GaN layer 1 (FIG. 3) by a standard thin film deposition method. This may be by plasma enhanced chemical vapor deposition ("PECVD"), sputtering, evaporation, or other suitable techniques.

Figure 4:
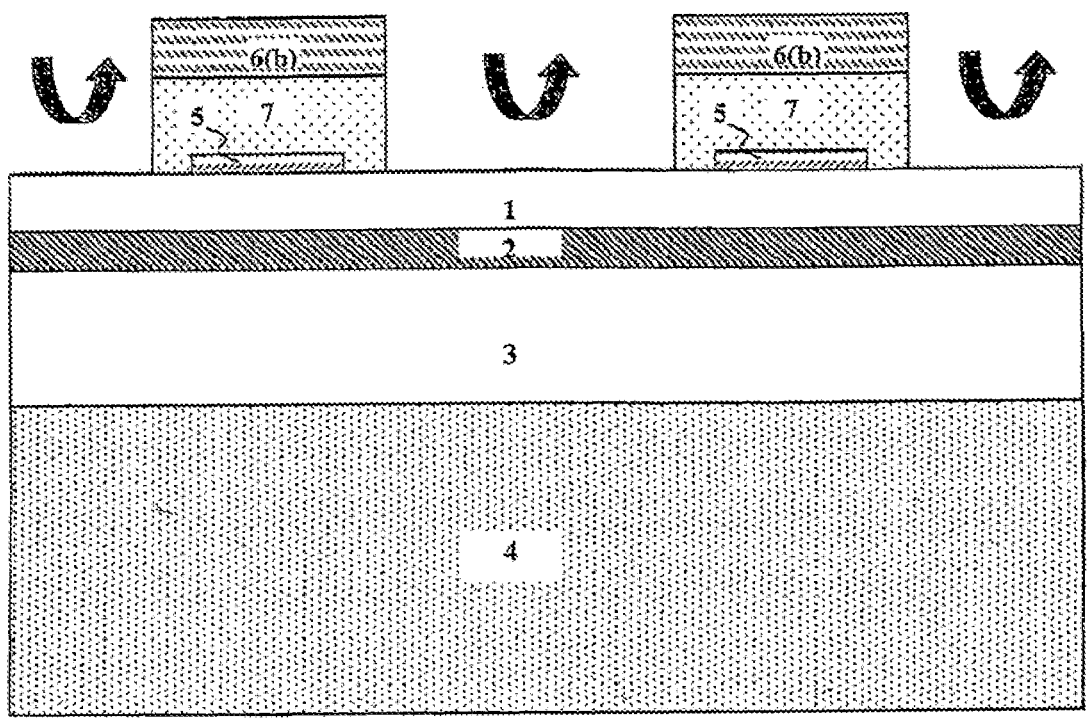
FIG. 4 is a non-scale schematic, cross-sectional view of a semiconductor at a fourth stage in the fabrication process.

As shown in FIG. 4, a second photoresist layer 6(b) is applied over the oxide layer 7, The resist is then patterned and serves as mask for patterning the oxide layer 7. Wet etching or dry etching (plasma etching) of the oxide layer 7 is carried out. The oxide in the areas where there is no photoresist 8(b) is removed, while oxide 7 protected by the resist 6(b) remains after etching. The patterned second resist layer 6(b) is larger in area than the NiAu layer 5 so that the $SiO_2$ layer 7 remaining extends across the NiAu layer 5 and down the sides of NiAu layer S to the p-type GaN layer 1, as shown in FIG. 4.

Figure 5:
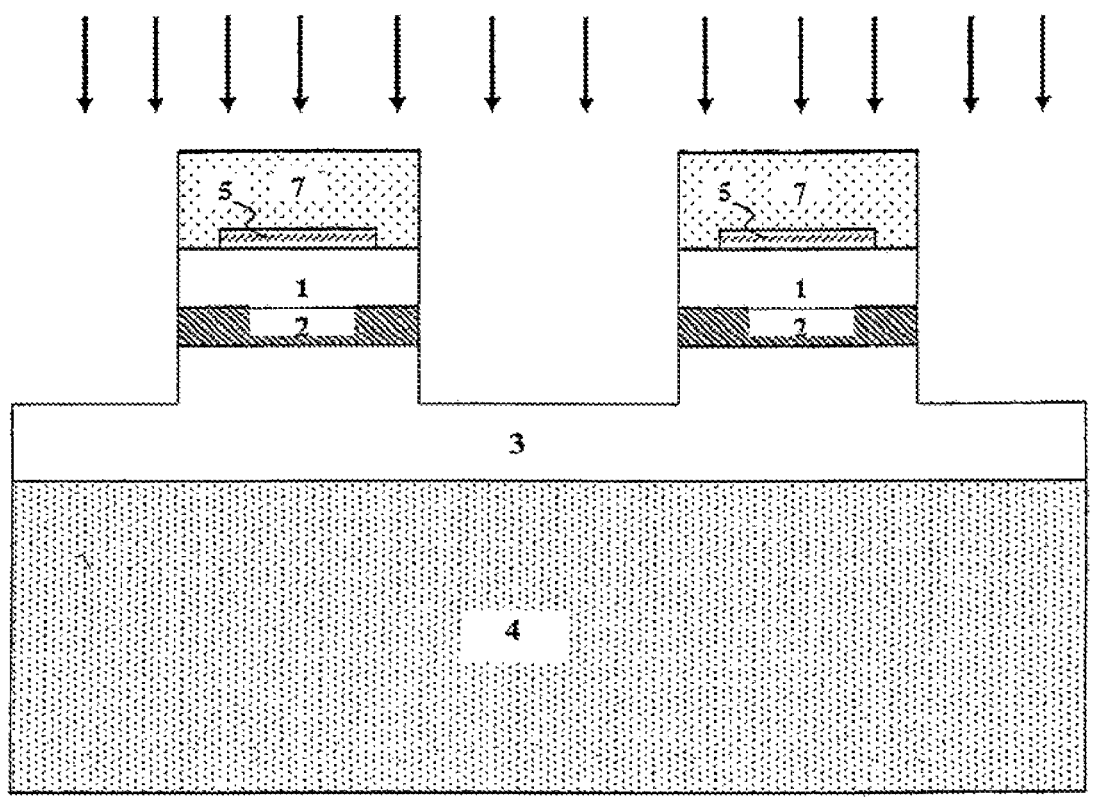
FIG. 5 is a non-scale schematic, cross-sectional view of a semiconductor at a fifth stags in the fabrication process.
Figure 6:
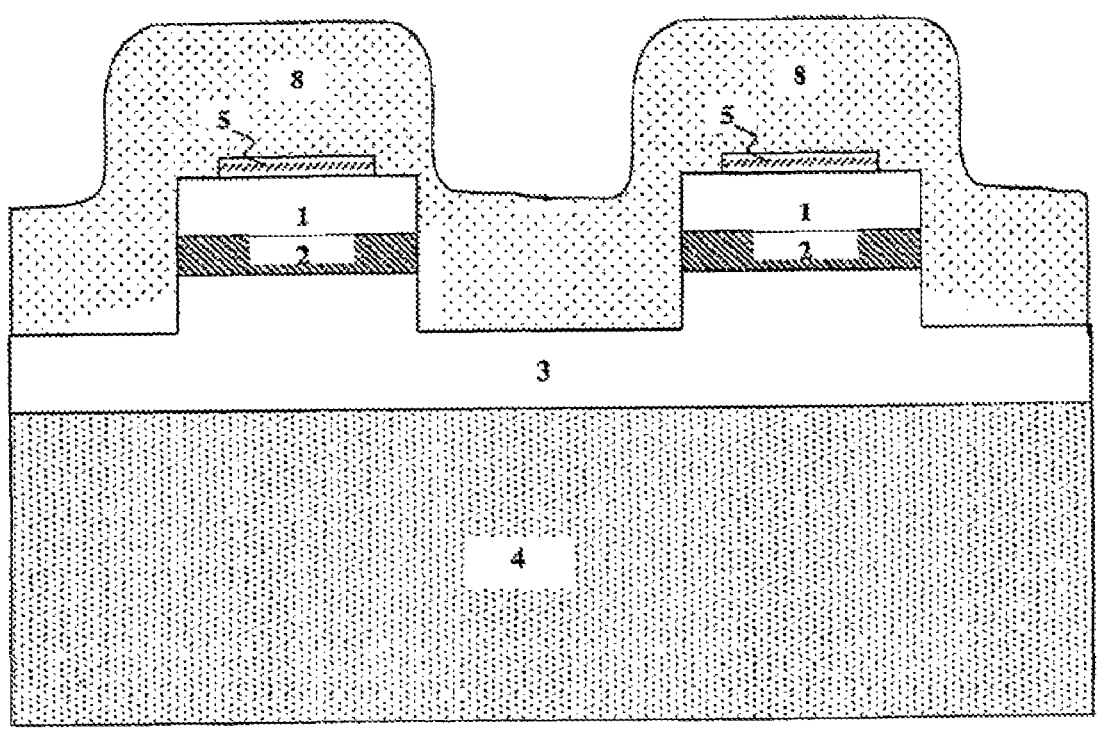
FIG. 6 is a non-scale schematic, cross-sectional view of a semiconductor at a sixth stage in the fabrication process.
Figure 7:
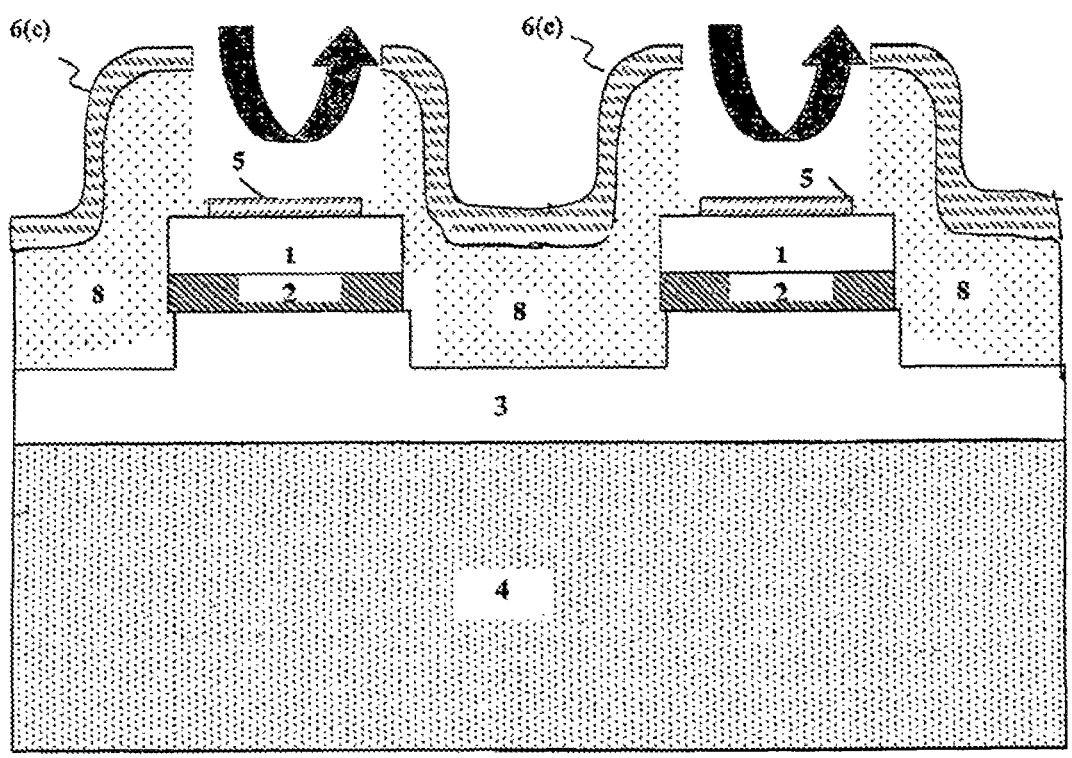
FIG. 7 is a non-scale schematic, cross-sectional view of a semiconductor at a seventh stage in the fabrication process.

As shown in FIG. 5, the second resist layer 8(b) is removed for mesa etching of the p-type GaN layer 1, the quantum well layer 2 and the n-type GaN layer 3. The etching is for the full depth of the p-type GaN layer 1, and the quantum well layer 2, but for a small part only of the depth of the n-type. GaN layer 3. The patterned oxide 7 in FIG. 5 serves as the dry etching mask to define the mesa on which the device is subsequently formed.

The $SiO_2$ layer 7 of FIG. 5 is removed and replaced by a full coating isolation layer 8 of $SiO_2$ (FIG. 8) that covers the entire top surface. A photoresist layer 6(c) is then applied over the $SiO_2$ layer 8. The photoresist layer 6(c) is then patterned by light exposure and subsequent development, so that it covers everywhere except the center part of the mesas—over the P-type metal layer 5. The third resist layer 8(c) extends around the periphery and toward the center, with the third resist layer 8(c) being generally annular. As such the third resist layer 6(c) does not cover the central portion 17 of $SiO_2$ layer 8, $SiO_2$ window etching follows to remove the central portion 17 of the $SiO_2$ layer 8 above the NiAu layer 5 to thus expose the top of the NiAu layer 5.

Figure 8:
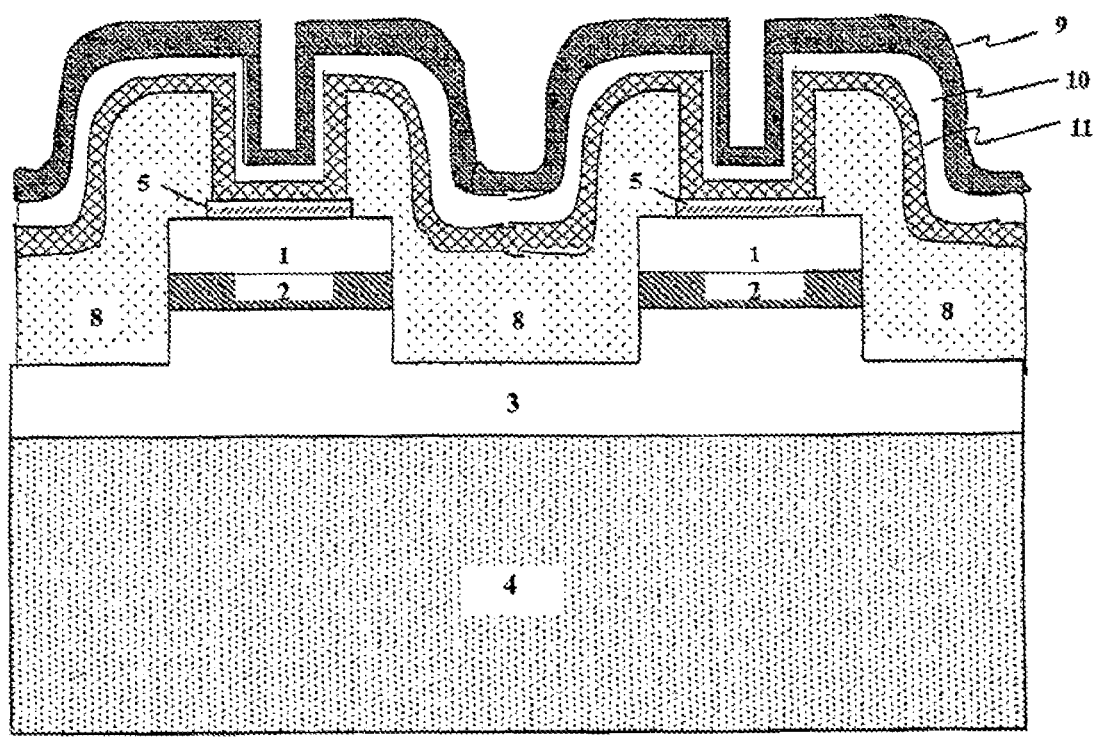
FIG. 8 is a non-scale schematic, cross-sectional view of a semiconductor at an eighth stage in the fabrication process.

The third resist layer 6(c) is then removed and seed layer deposition follows, as is shown in FIG. 8. The seed layer is of three different metal layers. The first seed layer 11 adheres well to the NiAu layer 5 and may be of chromium or titanium. It is followed by second layer 10 and third layer 9 of tantalum and copper respectively. Other materials may be used. The first seed layer 11 preferably has good reflectivity for the reflection of light generated in the light emitting device. The second seed layer 10 acts as a diffusion barrier, preventing copper or other materials placed on top of it (such as, for example, the third seed layer 9) from diffusing into the Ohmic contact layers and the semiconductor epitaxial layers. The third seed layer 9 acts as a seeding layer for subsequent electroplating.

The coefficients of thermal expansion of the seed layers may be different from that of GaN which is 3.17. While the thermal expansion coefficients of the Ohmic contact layers (Ni and Au) are also different from that of GaN (they are 14.2 and 13.4 respectively), they are relatively thin (a few nanometers) and do not pose serious stress problems to the underlining GaN epitaxial layers. However, plated copper to be added later may be as thick as hundreds of microns and thus may cause severe stress problems. Thus, the seed layers can be used to buffer the stress. This may be by one or more of:

(a) by having sufficient flexibility to absorb the stress,
(b) by having sufficient internal slip characteristics to absorb the stress,
(c) by having sufficient rigidity to withstand the stress, and
(d) by having graded thermal expansion coefficients.

In the case of graded thermal coefficients, that of the first layer 11 preferably less than that of the second layer 10, and that of the second layer is preferably less than that of the third layer 9. For example, the first layer 11 may be chromium with a coefficient of thermal expansion of 4.9, the second layer 10 may be tantalum with a coefficient of thermal expansion of 8.3, and the third layer 9 may be copper with a coefficient of thermal expansion of 16.5. In this way the coefficients of thermal expansion are graded from the $SiO_2$ layer 8 and GaN layer to the outer, copper layer 9. An alternative is to have coefficients of expansion that differ such that at the temperatures concerned, one metal layer expands while another contracts, If the outer, copper layer 8 was applied directly to the $SiO_2$ layer 8 and P-metal layer 5, the differences in their thermal expansion rates may cause cracking, separation, and/or failure. By depositing a plurality of seed layers 11, 10 and 9 of different materials, particularly metals each having a different coefficient of thermal expansion, the stresses of thermal expansion are spread through the layers 11, 10 and 9 with the resultant lower likelihood of cracking, separation and/or failure. The first seed layer 11 should be of a material with a relatively low coefficient of thermal expansion, whereas the final layer 9 may have a higher coefficient of thermal expansion, if there are intermediate layer(s) 10, the intermediate layer(s) should have coefficient(s) of expansion between those of layers 11 and 9, and should be graded from that of the first layer 11 to that of the final layer 9. There may be no intermediate layer 10, or there may be any required or desired number of intermediate layers 10 (one, two, three and so forth).

Alternatively, the seed layers 9, 10 and 11 may be replaced by a single layer of dielectric such as, for example, AlN with vias or holes therethrough to enable the copper layer 9(a) to connect to the p-type metal layer 5.

Figure 9:
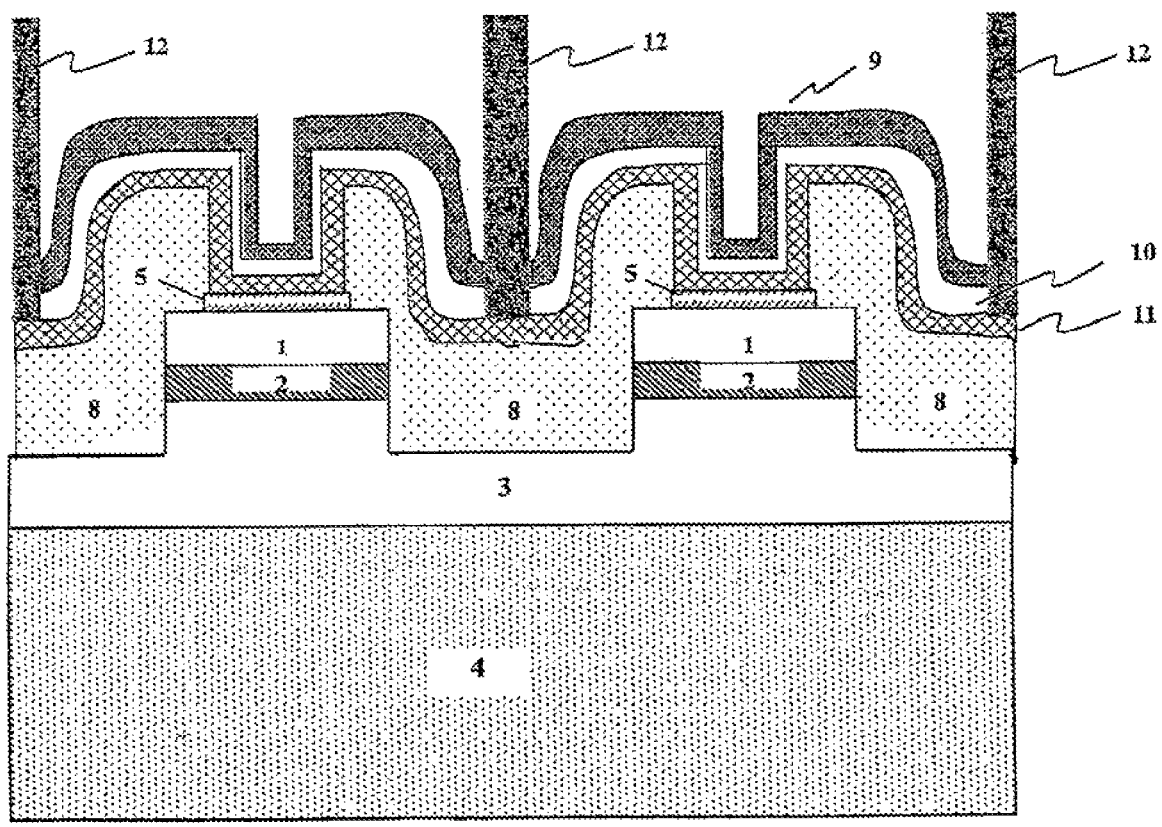
FIG. 9 is a non-scale schematic, cross-sectional view of a semiconductor at a ninth stage in the fabrication process.

For patterned plating of a relatively thick metal such as copper that will serve as the new substrate and heatsink after the removal of the original substrate 4, a pattern of thick resists 12 is applied to the outer, copper seed layer 9 by standard photolithography (FIG. 9), and the remaining metal 9(a) is plated in the regions defined by the thick resists 12 (FIG. 10), and then plated over the thick resists 12 to form a single metal support layer 9(a).

Figure 10:
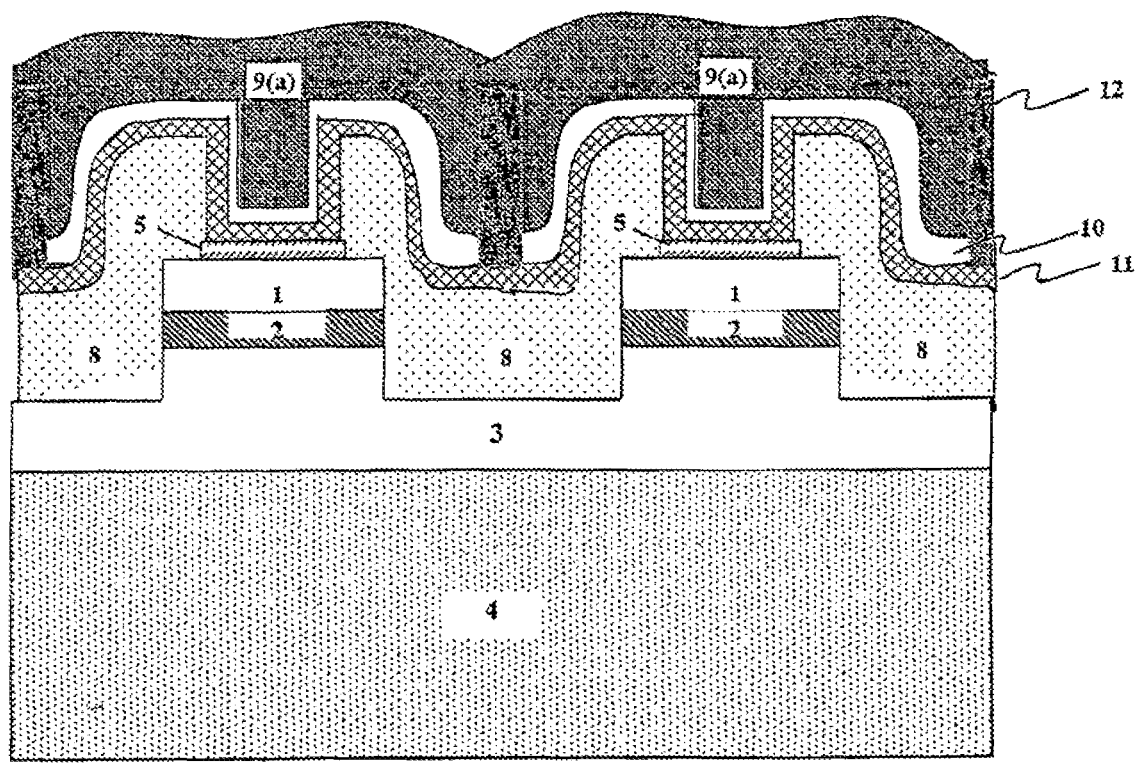
FIG. 10 is a non-scale schematic, cross-sectional view of a semiconductor at a tenth stage in the fabrication process.

Alternatively, before the application of the thick resists 12, the outer, seed copper layer 9 may be partially etched in the center of the street between the mesas for the formation of the thick photoresists 12 (FIG. 9) and plating of the main copper layer 9(a) (FIG. 10). This has the advantage of improved adhesion.

Figure 11:
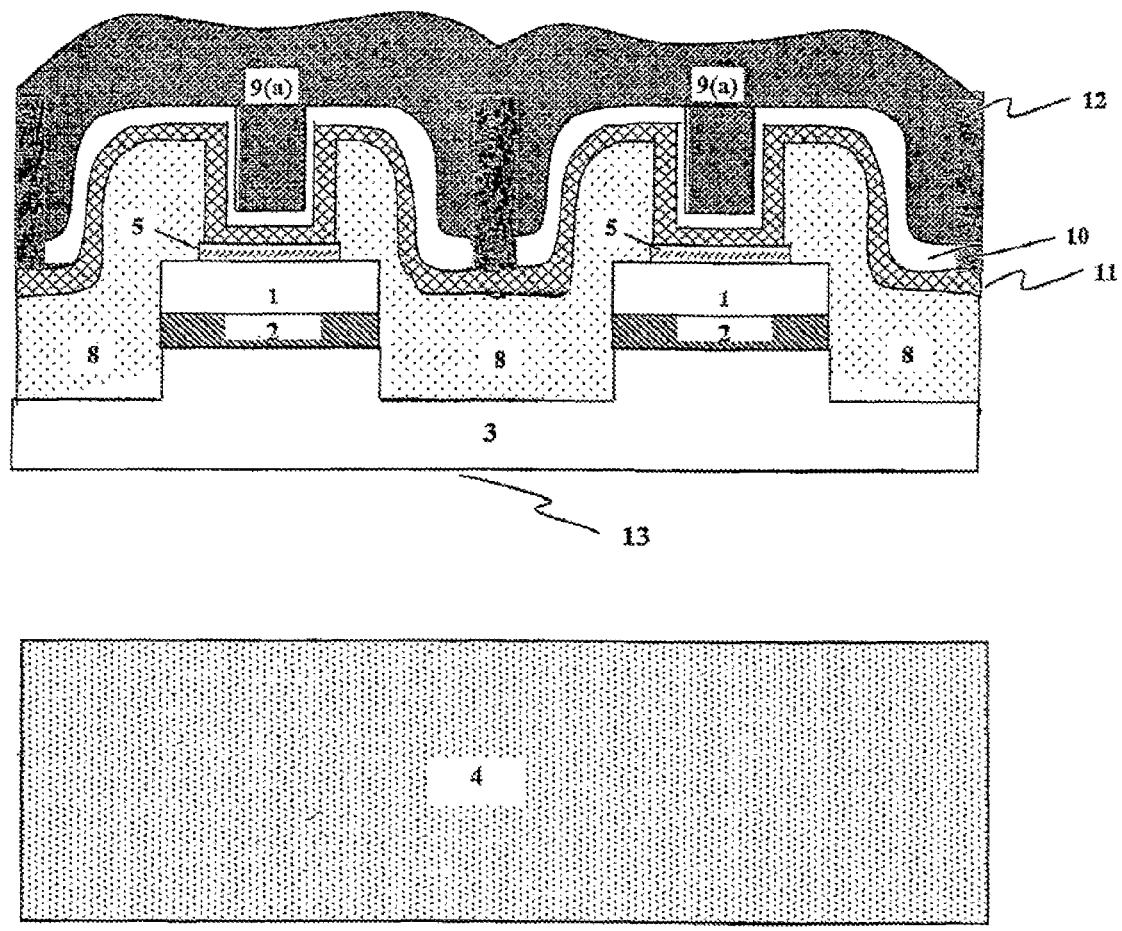
FIG. 11 is a non-scale schematic, cross-sectional view of a semiconductor at an eleven stage in the fabrication process.

The removal or lift-off of the sapphire substrate 9 then takes place (FIG. 11) in accordance with known techniques such as, for example, that described in Kelly [M. K. Kelly, O. Ambacher, R. Dimltrov, R, Handschuh, and M. Stutzmann, phys, stat. sol, (a) 159, R3 (1997)]. The substrate may also be removed by polishing or wet etching. This exposes the lowermost surface 13 of the n-type GaN layer 3. It is preferred for lift-off of the substrate 5 to take place while to epitaxial layers are intact to improve the quality of removal, and for structural strength. By having the epitaxial layers intact at the time of removal the electrical and mechanical properties of the epitaxial layers are preserved.

After the removal of the original substrate 4, the thickly plated metal 9(a) acts as: the new mechanical support; and during operation of the semiconductor device is able to act as one or more of; a heat sink, a heat dissipater, a terminal for the p-type layer 1, and as a current dissipater. As the p-type layer 1 is relatively thin, the heat generated in active layer 2 is more easily able to be conducted to the thick layer 3(a).

Figure 12:
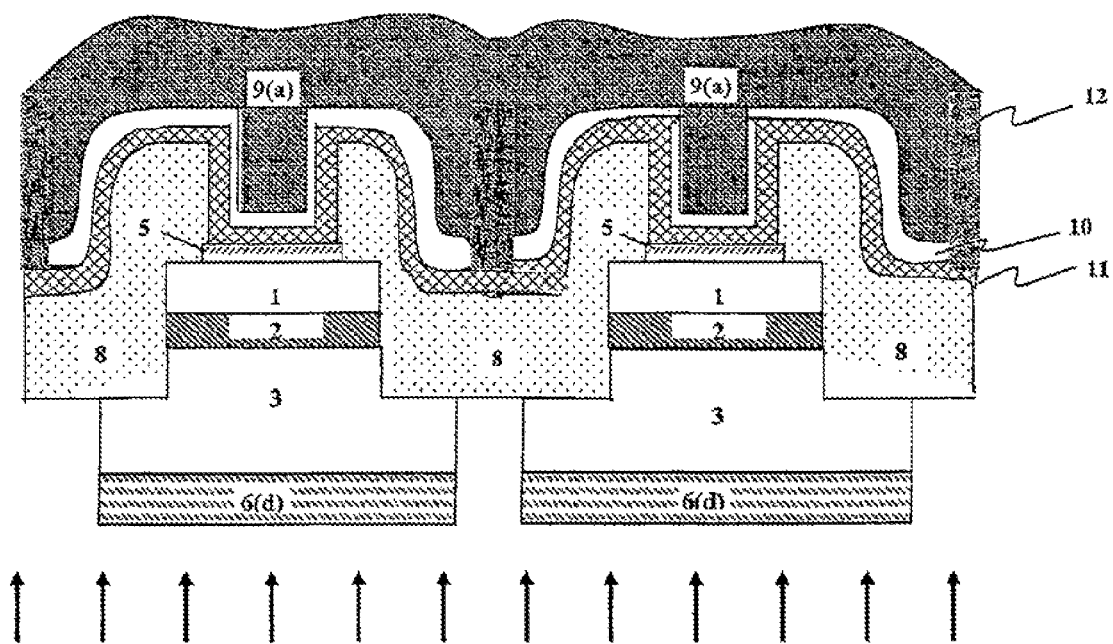
FIG. 12 is a non-scale schematic, cross-sectional view of a semiconductor at a twelfth stage in the fabrication process.
Figure 13A:
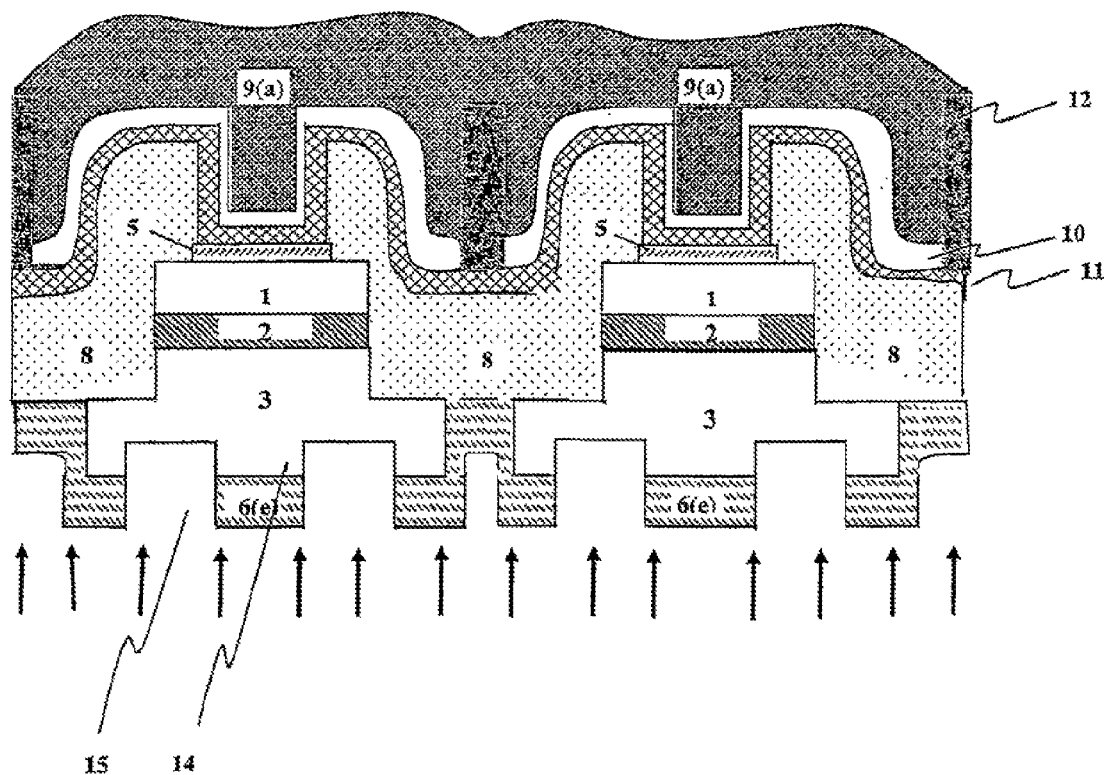
FIG. 13(a) is a non-scale schematic, cross-sectional view of a semiconductor at a thirteenth stage in the fabrication process.
Figure 13B:
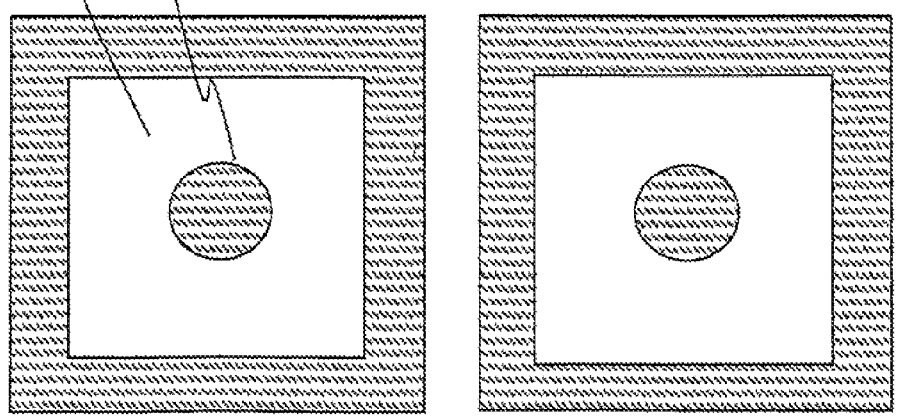
FIG. 13(b) is a bottom view of the semiconductor of FIG. 13(a)
Figures 14A, 14B:
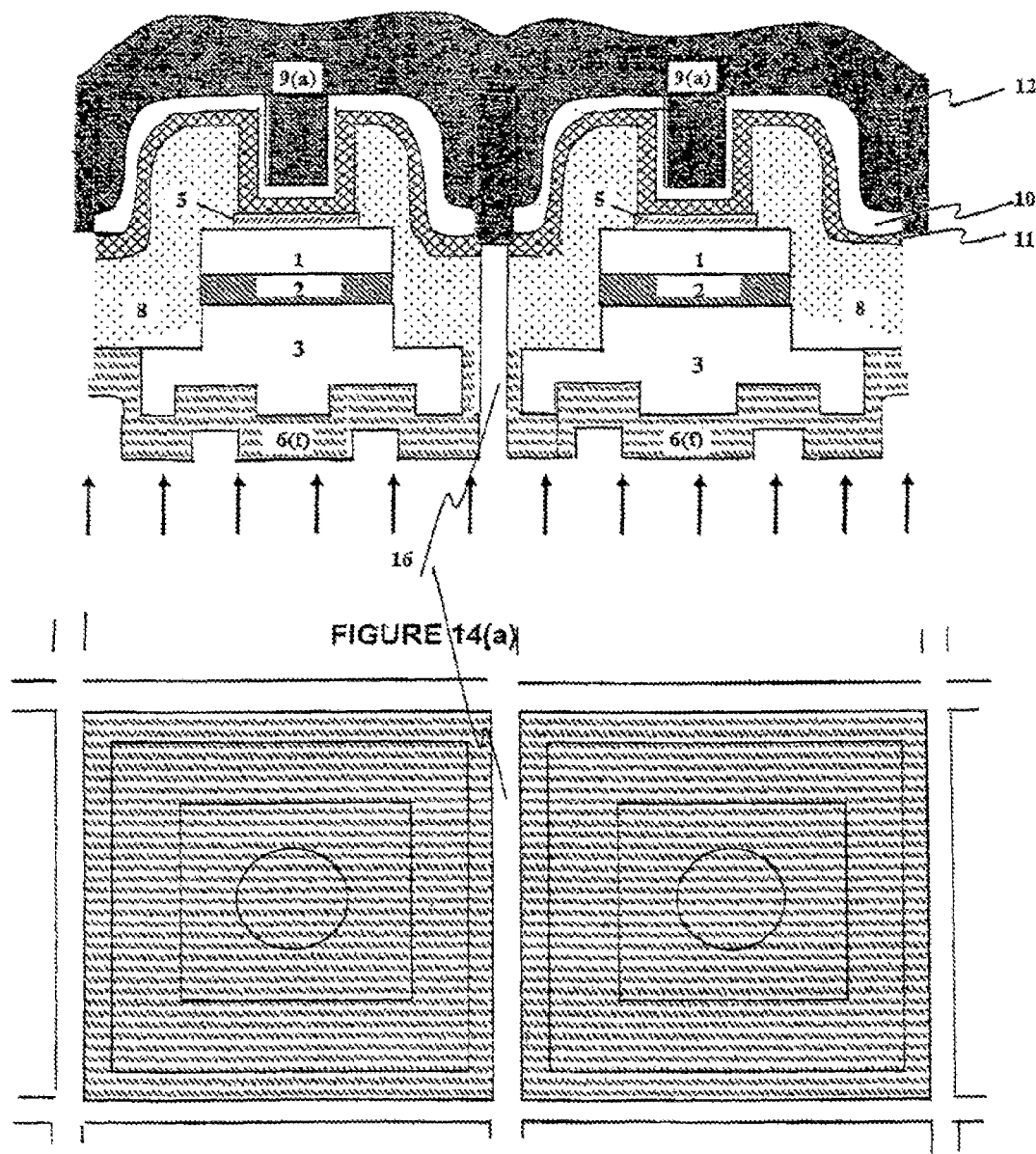
FIG. 14(a) is a non-scale schematic, cross-sectional view of a semiconductor at a fourteenth stage in the fabrication process.
FIG. 14(b) is a bottom view of the semiconductor of FIG. 14(a)

As shown in FIG. 12, the devices are then isolated from each other by trench etching from the newly exposed surface along the edges of the mesa, as shown in FIGS. 12 to 14, with a photoresist layer 6(d) protecting the regions of the n-type GaN layer 3 during the etching process.

Alternatively, the lowermost surface 13 of the n-type layer 3 may be cleaved at locations in alignment with the photoresists 12 and the dies separated. This is of advantage for laser diodes as the exposed side surfaces of the n-type layer 3 are substantially parallel, thus causing a large amount of total internal reflection. This acts as a light amplification system for improved, and directed, light output.

Pad etching takes place after applying a fifth resist layer 8(e) over the exposed surfaces of the $SiO_2$ layer 8, the sides of the n-type GaN layer 3, and the center of the n-type GaN layer 3 (FIGS. 13(a) and (b)) thus forming projecting portions 14 and recess portions 15 of n-type GaN layer 3.

The resist 8(e) is then removed and a sixth resist 6(f) applied over the exposed surfaces of the n-type GaN layer 3 and the outer periphery of the $SiO_2$ layer 8 to thus leave a gap 16 for die isolation. Etching takes place (FIG. 14) through the gap 16 and the $SiO_2$ layer 8, and seed layer 11 until the ends' of the thick photoresists 12 are exposed. The resist 6(f) is removed.

Figure 15A:
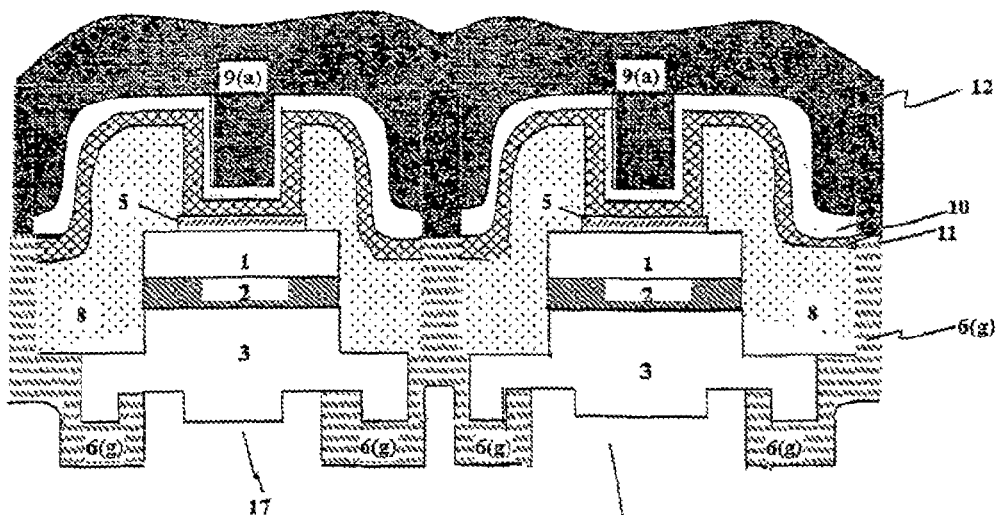
FIG. 15(a) is a non-scale schematic, cross-sectional view of a semiconductor at a fifteenth stage in the fabrication process.
Figure 15B:
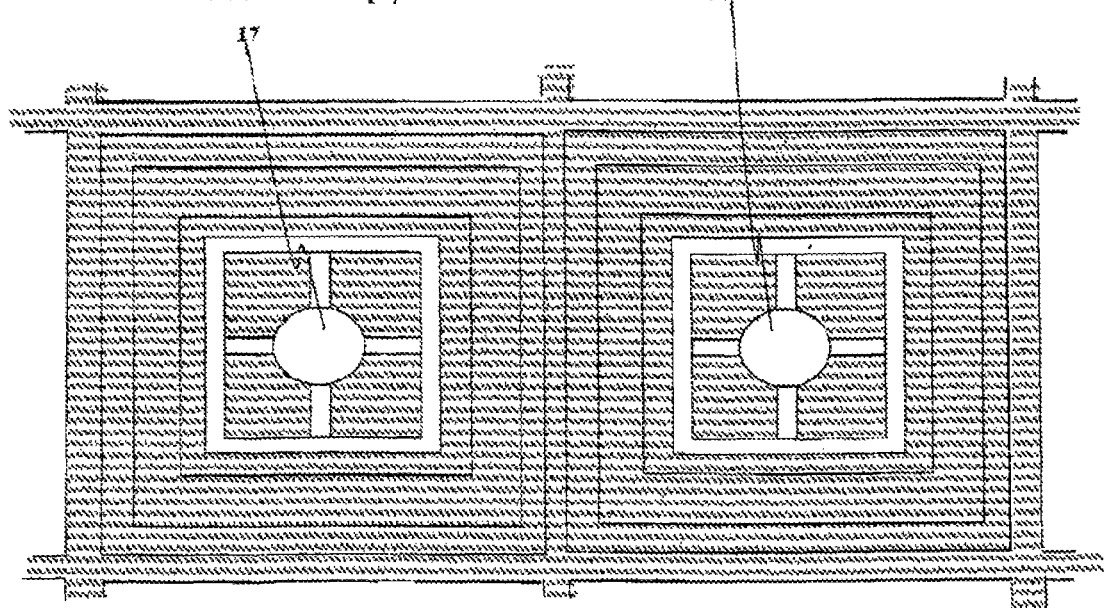
FIG. 15(b) is a bottom view of the semiconductor of FIG. 15(a)

A seventh resist layer 6(g) is applied over all exposed lower-surfaces from the edge Of the $SiO_2$ layer 8 through to adjacent the center of the n-type GaN layer 3, where a central gap 17 remains (FIG. 15).

Figure 16:
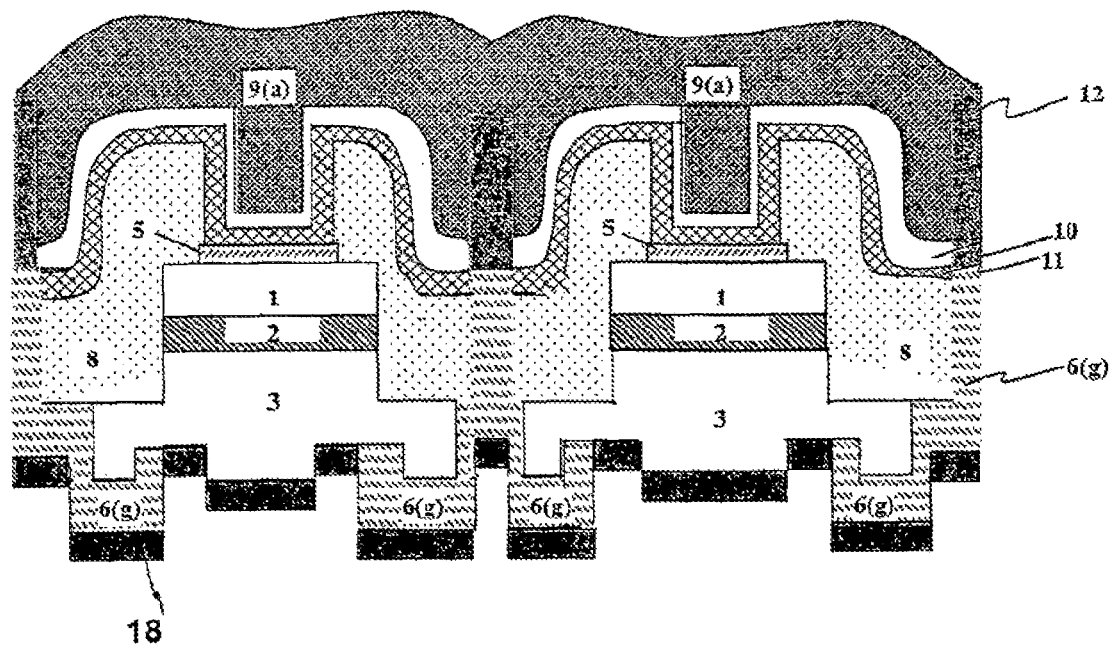
FIG. 16 is a non-scale schematic, cross-sectional view of a semiconductor at a sixteenth stage in the fabrication process.

A layer or layers 18 of n-type metals are then applied over the resist 6(g) with the layer 18 at the gap 17 at the center of the n-type GaN layer 3 being applied directly to the GaN layer 3 (FIG. 16). The resist layer 6(g) with the layer 18 attached, is removed leaving the layer 18 attached to She center 17 of the n-type GaN layer 3 where gap 17 was previously located.

Figure 17A:
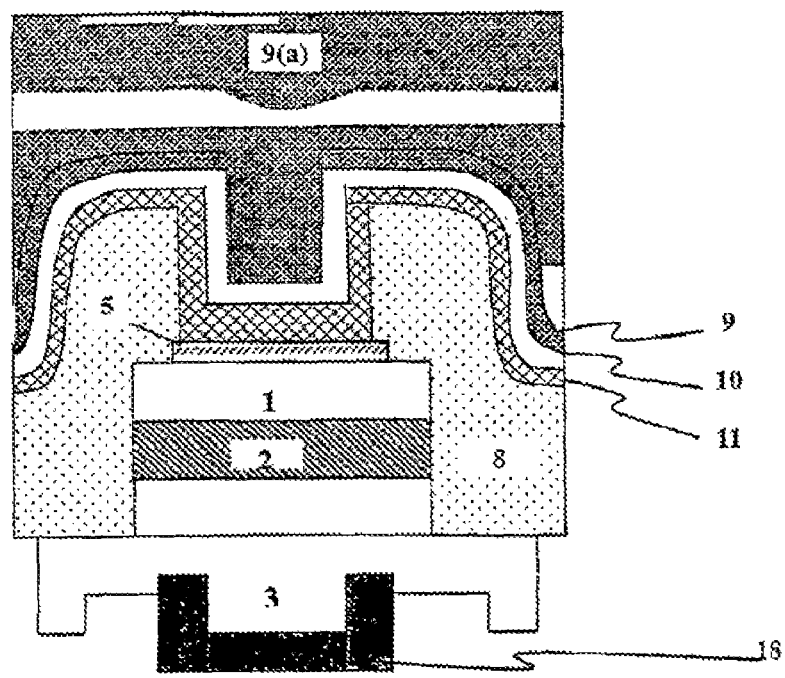
FIG. 17(a) is a non-scale schematic, cross-sectional view of a semiconductor at a seventeenth stage in the fabrication process.
Figure 17B:
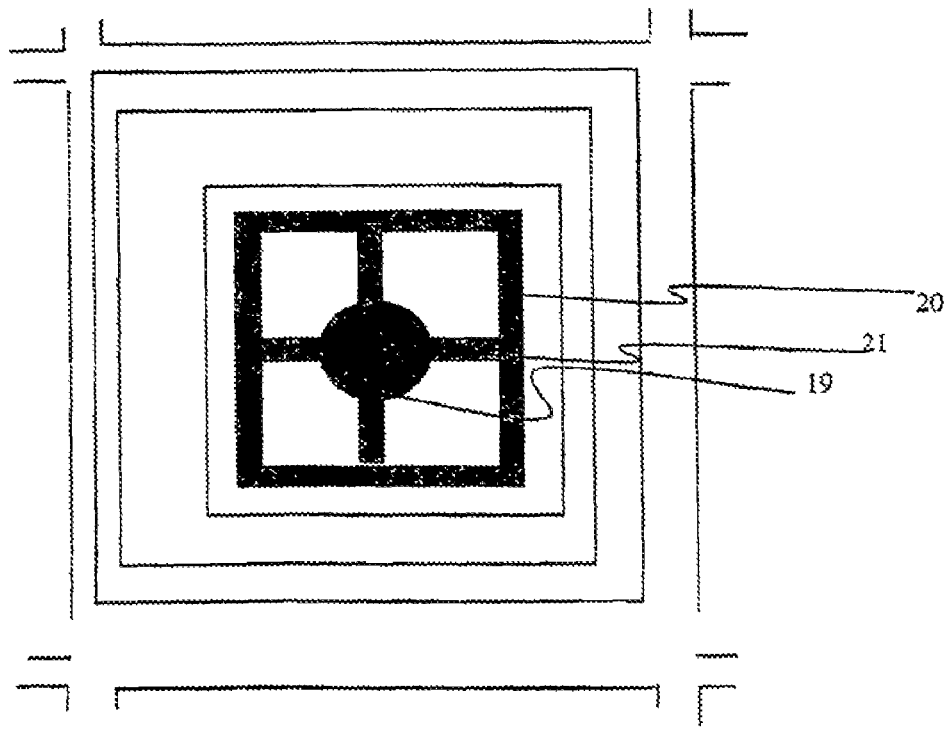
FIG. 17(b) is a bottom view of the semiconductor of FIG. 17(a).

The copper layer 9(a) is then polished flat (FIG. 17) and the dies separated. in this way the seed layers 11, 10, 9 and the copper layer 9(a) act as reflectors to increase light output, with copper layer 9(a) being one terminal, thus not interfering with light output. The second terminal is layer 18 on the n-type layer 3 of GaN and this is as an array at and/or around the center of that layer 3, thus minimizing its effect on light output, and increasing the diffusion of current. The array has a central portion 19 to which a bonding part wilt normally be applied, an outer portion 20 and joining portion 21 connection the central portion 19 and the outer portion 20. The outer portion 20 and joining portion 21 are for dispersion of current to maximize light output. As shown in FIG. 17(a) portions 20, 21 may have a small trench formed in the layer 3 to aid adhesion.

After polishing of the copper layer 9(a) the dies may be left with several dies being physically interconnected, but being electrically isolated on the n-type layer side by virtue of the silicon oxide layer 8. The n-type layer connections will be in accordance with normal practice and will be addressable individually, collectively, or in any desired or required combination or permutation. The p-type layers will have a common connection for all dies by means of the copper layer 9(a).

In this way the several dies can be operated at the one time for maximum light output, or in any possible combination or sequence, by appropriate control of the n-type layer connections. The copper layer 9(a) provides common connectivity on the p-type layer side, physical strength and support, and acts as a common heat sink. The presence of the oxide layer 8 provides electrical isolation and prevents leakage.

Although the layer 18 is shown having a square, cruciform and dot array, it may have any suitable form and shape of array.

For growing high quality GaN layers, if is common that the first 0.5-1.5 micron GaN layer 4 in FIG. 1 is undoped, and thus it is electrically nonconductive. For current conduction, this layer needs to be removed by etching. However, for the area where the bonding pad 19 is to be deposited, it is advantageous to keep this nonconductive layer under the bonding pad 19, so that the current does not flow vertically through this area, but spreads through the n-GaN layer 3. FIG. 17(a) shows an example contact, where under the circular bonding pad 19 the nonconductive material is retained.

Whilst there has been described in the foregoing description preferred embodiments of the present invention, it will be understood by those skilled in the technology concerned that many variations or modifications in details of design or construction may be made without departing from the present invention.

What is claimed:

1. A method for fabrication of a semiconductor device for light emission, the method comprising:
   on a p-type layer of plurality of epitaxial layers of the semiconductor device, forming a layer of a p-type metal; and
   on the layer of p-type metal, applying a first seed layer of a plurality of seed layers, the first seed layer being of a first material that is light reflective and has a first co-efficient of thermal expansion; and
   forming on the first seed layer a second seed layer of the plurality of seed layers, the second seed layer being a second material that has a second co-efficient of thermal expansion, the second co-efficient of thermal expansion being greater than the first co-efficient of thermal expansion.

2. The method of claim 1, wherein one of the plurality of seed layers is a diffusion barrier for providing a barrier to diffusion of a layer applied to it from diffusing into the p-type layer.

3. The method of claim 1 further comprising forming an array of an n-type metal on an n-type metal layer of the plurality of epitaxial layers, the array and the outer layer being the terminals for the semiconductor device.

4. The method of claim 1 further comprising forming at least one intermediate seed layer on the first seed layer before the second seed layer is formed, the at least one intermediate seed layer being of at least one material having an intermediate co-efficient of thermal expansion that is greater than the first co-efficient of thermal expansion and less than the second co-efficient of thermal expansion.

5. The method of claim 1 further comprising:
   on the second seed layer, forming an outer layer of a conductive material; and
   on an n-type layer of the plurality of epitaxial layers, forming an n-type metal in an array at the centre of the n-type layer for minimizing its effect on light output; the n-type metal and the outer layer being the terminals for the semiconductor device.

6. The method of claim 1 further comprising:
   forming an outer layer on the second seed layer, the outer layer being relatively thick; and
   separating the substrate from the plurality of epitaxial layers while the plurality of epitaxial layers is intact for preserving electrical and mechanical properties of the plurality of epitaxial layers.

7. The method of claim 6, wherein before the outer layer is formed on the second seed layer, the method further comprising:
   applying a layer of an oxide over the p-type metal ohmic contact layer and the p-type layer;
   removing the oxide layer from above the metal ohmic contact layer; and
   depositing the first and second seed layers on the oxide layer and the metal ohmic contact layer.

8. The method of claim 7, wherein a pattern of thick resists is applied to the outer layer, the outer layer being thereby formed between the pattern of thick resists.

9. The method of claim 7, wherein subsequent to separation of the substrate the method further comprising:
   a first stage of isolation of individual devices by trench etching along edges of each mesa;
   pad etching;
   die isolation;
   forming an array of n-type ohmic contacts on an n-type layer of the plurality of epitaxial layers; and
   die separation.

* * * * *